(12) United States Patent
Ichimura et al.

(10) Patent No.: US 10,128,406 B2
(45) Date of Patent: Nov. 13, 2018

(54) GAN TEMPLATE SUBSTRATE

(71) Applicant: NGK INSULATORS, LTD., Aichi (JP)

(72) Inventors: Mikiya Ichimura, Ichinomiya (JP);
Yoshitaka Kuraoka, Okazaki (JP);
Masahiko Namerikawa, Seto (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 15/099,716

(22) Filed: Apr. 15, 2016

(65) Prior Publication Data

US 2016/0233380 A1 Aug. 11, 2016

Related U.S. Application Data

(63) Continuation of application No. PCT/JP2014/073488, filed on Sep. 5, 2014.
(Continued)

(51) Int. Cl.
*H01L 29/20* (2006.01)
*H01L 29/778* (2006.01)
(Continued)

(52) U.S. Cl.
CPC ............. *H01L 33/12* (2013.01); *C30B 9/10* (2013.01); *C30B 19/02* (2013.01); *C30B 19/12* (2013.01);
(Continued)

(58) Field of Classification Search
CPC .... H01L 29/2003; H01L 33/12; H01L 29/778
See application file for complete search history.

(56) References Cited

U.S. PATENT DOCUMENTS 7,507,292 B2 3/2009 Sasaki et al.
7,655,090 B2 2/2010 Marchand et al.
(Continued)

FOREIGN PATENT DOCUMENTS

JP 2004-506323 A 2/2004
JP 2007-169132 A 7/2007
(Continued)

OTHER PUBLICATIONS

Harima, "Properties of GaN and related compounds studied by means of Raman scattering", Journal of Physics: Consdensed Matter, 14 (2002): p. 967-993.*
(Continued)

*Primary Examiner* — Michele Fan
(74) *Attorney, Agent, or Firm* — Cermak Nakajima & McGowan LLP; Tomoko Nakajima

(57) ABSTRACT

A device substrate in which no streaked morphological abnormality occurs is achieved. A GaN template substrate includes: a base substrate; and a first GaN layer epitaxially formed on the base substrate, wherein the first GaN layer has a compressive stress greater than or equal to 260 MPa that is intrinsic in an inplane direction, or a full width at half maximum of a peak representing E2 phonons of GaN near a wavenumber of 568 cm$^{-1}$ in a Raman spectrum is lower than or equal to 1.8 cm$^{-1}$. With all of these requirements, a device substrate includes: a second GaN layer epitaxially formed on the first GaN layer; and a device layer epitaxially formed on the second GaN layer and made of a group 13 nitride.

6 Claims, 2 Drawing Sheets

Related U.S. Application Data

(60) Provisional application No. 61/901,206, filed on Nov. 7, 2013.

(51) Int. Cl.

| | | |
|---|---|---|
| *H01L 33/12* | (2010.01) | |
| *C30B 25/02* | (2006.01) | |
| *C30B 29/40* | (2006.01) | |
| *H01L 21/02* | (2006.01) | |
| *C30B 9/10* | (2006.01) | |
| *C30B 19/02* | (2006.01) | |
| *C30B 19/12* | (2006.01) | |
| *C30B 29/68* | (2006.01) | |
| *H01L 29/66* | (2006.01) | |
| *H01L 33/00* | (2010.01) | |
| *H01L 33/32* | (2010.01) | |
| *H01L 33/06* | (2010.01) | |

(52) U.S. Cl.
CPC ............ *C30B 25/02* (2013.01); *C30B 29/406* (2013.01); *C30B 29/68* (2013.01); *H01L 21/0242* (2013.01); *H01L 21/0254* (2013.01); *H01L 21/0262* (2013.01); *H01L 21/02458* (2013.01); *H01L 21/02502* (2013.01); *H01L 29/66462* (2013.01); *H01L 29/7787* (2013.01); *H01L 33/007* (2013.01); *H01L 33/32* (2013.01); *H01L 29/2003* (2013.01); *H01L 29/778* (2013.01); *H01L 33/06* (2013.01)

(56) References Cited

U.S. PATENT DOCUMENTS

| | | | |
|---|---|---|---|
| 7,687,888 | B2 | 3/2010 | Marchand et al. |
| 7,816,764 | B2 | 10/2010 | Marchand et al. |
| 8,525,230 | B2 | 9/2013 | Marchand et al. |
| 9,129,977 | B2 | 9/2015 | Marchand et al. |
| 2002/0020341 | A1 | 2/2002 | Marchand et al. |
| 2006/0051942 | A1 | 3/2006 | Sasaki et al. |
| 2007/0145376 | A1* | 6/2007 | Okui .................... C30B 29/406 257/76 |
| 2007/0281419 | A1* | 12/2007 | Alhomoudi ........... C23C 14/083 438/240 |
| 2012/0061728 | A1* | 3/2012 | Javey .................. H01L 21/2007 257/192 |
| 2013/0202813 | A1* | 8/2013 | Chueh ................. C01B 31/0446 427/557 |
| 2013/0234106 | A1* | 9/2013 | Sugiyama ............... H01L 33/12 257/13 |
| 2013/0234146 | A1* | 9/2013 | Prechtl ............. H01L 29/66462 257/76 |
| 2014/0008609 | A1* | 1/2014 | Chiu ...................... H01L 33/24 257/13 |
| 2014/0367698 | A1 | 12/2014 | Marchand et al. |
| 2015/0050471 | A1 | 2/2015 | Lipski et al. |
| 2015/0292111 | A1 | 10/2015 | Grunder et al. |

FOREIGN PATENT DOCUMENTS

| | | |
|---|---|---|
| WO | WO02/13245 A1 | 2/2002 |
| WO | WO2004/013385 A1 | 2/2004 |
| WO | WO2013/139888 A1 | 9/2013 |

OTHER PUBLICATIONS

International Search Report for PCT Patent App. No. PCT/JP2014/073488 (dated Dec. 9, 2014).
"Frontier Epitaxial Growth," Dynamics of Crystal Growth, vol. IV, Nakajima, Kazuo, ed., Kyoritsu Shuppan Co., Ltd., pp. 14-19. [This document discloses that for example, laminating GaN films thicker on a sapphire substrate may cause a crack, and introduction of a low-temperature interlayer in a layered structure will be effective to prevent occurrence of such a crack].
International Preliminary Report on Patentability for PCT Patent App. No. PCT/JP2014/073488 (dated May 10, 2016) with English translation thereof.
Liu, Z., et al., "Strain in GaN Epi-Layer Grown by Hydride Vapor Phase Epitaxy," Spectroscopy and Spectral Analysis, vol. 33, No. 8, pp. 2105-2108, with partial English language translation.
Office Action from Chinese Patent App. 201480057318.1 dated Sep. 15, 2017 with English language translation thereof.
Office Action from Japanese Patent App. No. 2015-546322 (dated Feb. 13, 2018).

* cited by examiner

Figure 2
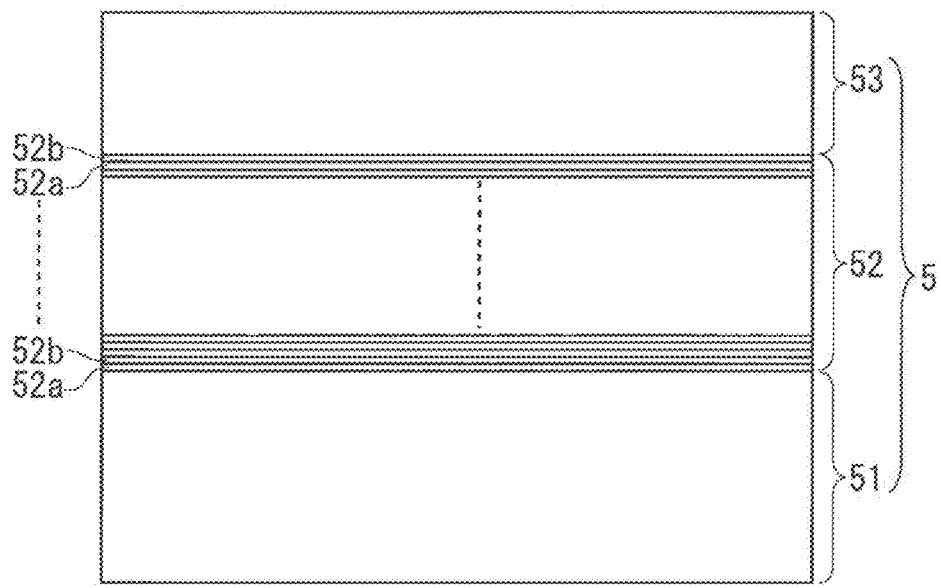
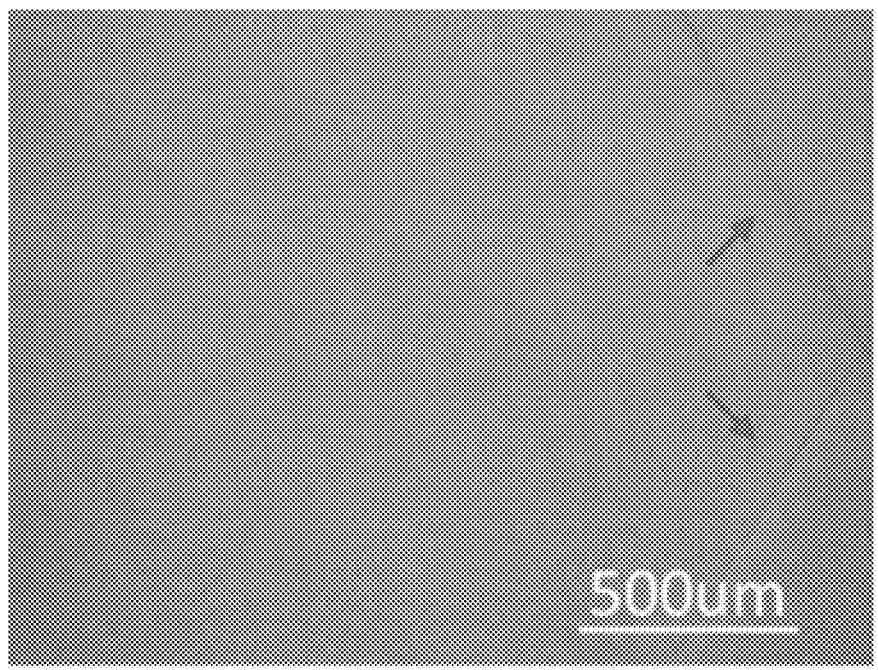
Figure 3     Prior Art

GAN TEMPLATE SUBSTRATE

CROSS-REFERENCE TO RELATED APPLICATIONS

This application is a National Stage Entry of PCT/EP2008/062237, filed Sep. 15, 2008, which claims priority from provisional application 62/128,275, filed Jun. 16, 2008, and from provisional application 61/1009,195, filed Dec. 27, 2007. The contents of these priority applications are incorporated herein by reference in their entirety.

TECHNICAL FIELD

The present invention relates to a GaN template substrate in which a GaN layer is formed on a base substrate.

BACKGROUND ART

Conventionally, there was a problem that streaked morphological abnormality occurred on surfaces of device substrates when the device substrates were fabricated by laminating device structures made of group 13 nitrides on Flux-GaN templates. FIG. 3 is a Nomarski differential interference microscope image of a surface of a device substrate on which the morphological abnormality occurs. In FIG. 3, the streaked morphological abnormality (line crack) is identified in a portion marked with an arrow. Since among device chips (LED chips, HEMT chips, etc.) obtained by dicing the device substrates, device chips formed in portions with the morphological abnormality may become characteristic defectives that cannot exhibit desired characteristics, occurrence of the morphological abnormality is a factor that reduces productivity of the device chips.

The factor causing the streaked morphological abnormality has not necessarily been clarified yet.

On the other hand, it is generally known that for example, laminating GaN films thicker on a sapphire substrate may cause a crack, and it has already been found that introduction of a low-temperature interlayer in a layered structure will be effective to prevent occurrence of such a crack (see, for example, Non-Patent Document 1).

However, there is a problem in this method that the resulting layered structure involves crystal defects due to use of a low-quality interlayer, and consequently, the crystal defects interfere with fabrication of high-quality devices (LEDs, HEMTs).

PRIOR-ART DOCUMENTS

Patent Documents

Non-Patent Document 1: "FRONTIER EPITAXIAL GROWTH", DYNAMICS OF CRYSTAL GROWTH, volume IV, Nakajima, Kazuo, ed., Kyoritsu Shuppan Co., Ltd., pages 14-19.

SUMMARY OF INVENTION

The object of the present invention is to achieve a device substrate in which no streaked morphological abnormality occurs.

The Inventors of the present invention have found through the repetition of various studies that the streaked morphological abnormality can be suppressed when the GaN films have high intrinsic compressive stress or high crystallinity in MOCVD-GaN templates (seed substrates). Here, the compressive stress and the crystallinity are values that can be quantified by Raman spectroscopy.

In order to solve the problems, in a first aspect of the present invention, a GaN template substrate includes: a base substrate made of sapphire; a buffer layer formed on the base substrate and made of GaN; and a first GaN layer epitaxially formed on buffer layer, wherein the first GaN layer has a compressive stress greater than or equal to 260 MPa, the compressive stress being intrinsic in an inplane direction.

In a second aspect of the present invention, a GaN template substrate includes: a base substrate made of sapphire; and a first GaN layer epitaxially formed on the base substrate, wherein a full width at half maximum of a peak near a wavenumber of 568 $cm^{-1}$ in a Raman spectrum is lower than or equal to 1.8 $cm^{-1}$, the peak representing E2 phonons of GaN, the Raman spectrum being obtained by measuring the first GaN layer by Raman spectroscopy.

In a third aspect of the present invention, a GaN template substrate includes: a base substrate made of sapphire; a buffer layer formed on the base substrate and made of GaN; and a first GaN layer epitaxially formed on buffer layer, wherein the first GaN layer has a compressive stress greater than or equal to 260 MPa, the compressive stress being intrinsic in an inplane direction, and a full width at half maximum of a peak near a wavenumber of 568 $cm^{-1}$ in a Raman spectrum is lower than or equal to 1.8 $cm^{-1}$, the peak representing E2 phonons of GaN, the Raman spectrum being obtained by measuring the first GaN layer by Raman spectroscopy.

In a fourth aspect of the present invention, in the GaN template substrate according to the first or third aspect, a value of the compressive stress is obtained from a Raman spectrum obtained by measuring the first GaN layer by Raman spectroscopy.

In a fifth aspect of the present invention, the GaN template substrate according to any one of the first to fourth aspects further includes a second GaN layer epitaxially formed on the first GaN layer.

In a sixth aspect of the present invention, in the GaN template substrate according to the first to third aspects, the thickness of the first GaN layer is 1 μm to 5 μm.

According to the first to sixth aspects of the present invention, since occurrence of the streaked morphological abnormality on the surface of the device substrate fabricated using the GaN template substrate according to the present invention is suppressed, the manufacturing yield of device chips (LED chips and HEMT chips) will be improved.

BRIEF DESCRIPTION OF DRAWINGS

FIG. 2 exemplarily illustrates a structure of a device layer 5 formed with an LED structure.

FIG. 3 is a Nomarski differential interference microscope image of a surface of a device substrate on which the morphological abnormality occurs.

DESCRIPTION OF EMBODIMENTS

Figure 1:
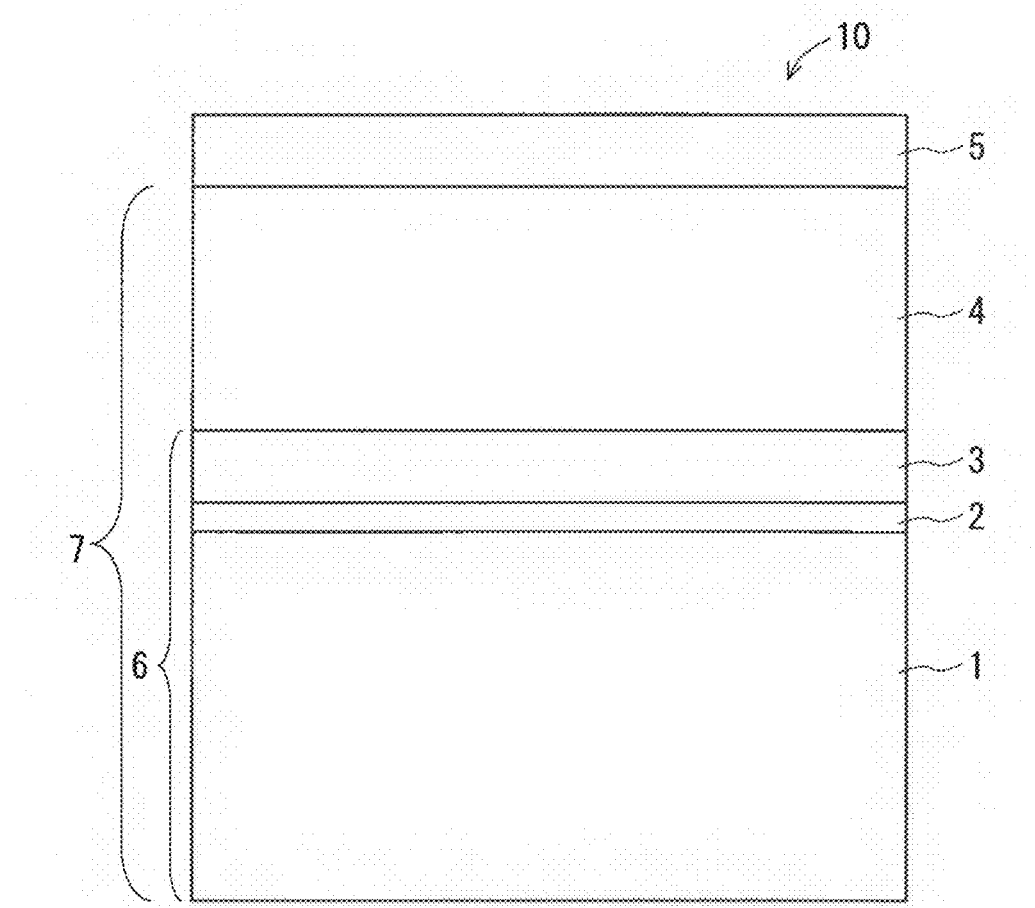
FIG. 1 schematically illustrates a cross-sectional structure of a device substrate 10.

The group numbers of the periodic table in this Description are from groups 1 to 18 in Nomenclature of Inorganic Chemistry revised in 1989 by the International Union of Pure and Applied Chemistry (IUPAC). Group 13 refers to, for example, aluminum (Al), gallium (Ga), and indium (In), and group 15 refers to, for example, nitrogen (N), phosphorous (P), arsenic (As), and antimony (Sb).

FIG. 1 schematically illustrates a cross-sectional structure of a device substrate 10 according to an embodiment of the present invention. The device substrate 10 includes a base substrate 1, a buffer layer 2, a first GaN layer 3, a second GaN layer 4, and a device layer 5. Here, a layered structure of the base substrate 1, the buffer layer 2, and the first GaN layer 3 corresponds to a MOCVD-GaN template 6, and a layered structure of the MOCVD-GaN template 6 and the second GaN layer 4 corresponds to a Flux-GaN template 7.

Preferably, a single-crystal c-plane sapphire substrate is used as the base substrate 1. Although the size of the base substrate 1 is not particularly limited, preferably, the base substrate 1 is approximately several inches in diameter and several hundred μms to several mms in thickness for ease of handling.

The buffer layer 2 is a layer formed at a forming temperature lower than those of group 13 nitride crystal layers which are formed on the buffer layer 2 so that these group 13 nitride crystal layers can be formed superior in crystal quality. The buffer layer 2 may be made of, for example, GaN. The buffer layer 2 is preferably formed on the base substrate 1 with a thickness of 20 nm to 100 nm by the MOCVD method.

The first GaN layer 3 is a GaN single-crystal thin film epitaxially formed on the buffer layer 2 by the MOCVD method. The first GaN layer 3 is preferably formed with a thickness of 1 μm to 5 μm.

The first GaN layer 3 is formed to have a compressive stress greater than or equal to 260 MPa that is intrinsic in the inplane direction. Alternatively, the first GaN layer 3 is formed in such a manner that a full width at half maximum of a peak (Raman line) near the wavenumber of 568 $cm^{-1}$ in a Raman spectrum obtained by measuring the first GaN layer 3 by Raman spectroscopy is lower than or equal to 1.8 $cm^{-1}$, where the peak represents E2 phonons of GaN. The full width at half maximum of the peak is a value that is an indicator representing the quality of crystallinity of the first GaN layer 3, and thus, the smaller the value is, the crystallinity of the first GaN layer 3 is higher. Furthermore, the compressive stress intrinsic in the inplane direction of the first GaN layer 3 can be calculated based on the Raman spectrum. Specifically, the compressive stress can be calculated from the following Equation representing a relationship between the shift amount of the above-described peak $\Delta v$ ($cm^{-1}$) and the intrinsic stress $\sigma$ (MPa):

$$\sigma = 130 \times \Delta v \quad \text{(Equation 1)}$$

The peak of the Raman spectrum shifts to the higher wavenumbers (positive side) when an object to be measured has a compressive stress, whereas the peak shifts to the lower wavenumbers (negative side) when the object has a tensile stress. Here, a value of a reference wavenumber indicative of a state of no stress (a peak position of the E2 phonons of GaN in the state) is obtained by measuring a GaN single crystal without any strain (a GaN single crystal which is fabricated by the Flux method and whose growth starts from a nucleus spontaneously generated) as a subject by Raman spectroscopy under the same conditions as described above.

In the device substrate 10 according to the embodiment, the streaked morphological abnormality on the surface is appropriately suppressed by satisfying the requirements on at least one of the intrinsic stress and the full width at half maximum. These requirements can be satisfied by adjusting the forming conditions of the first GaN layer 3, specifically, a film formation temperature (substrate temperature) and a ratio between a partial pressure of a hydrogen gas and that of an $NH_3$ gas.

The second GaN layer 4 is a GaN single-crystal thin film epitaxially formed on the first GaN layer 3 by the Flux method. The second GaN layer 4 is preferably formed with a thickness of 5 μm to 500 μm. More specifically, the second GaN layer 4 is formed by, for example, polishing a GaN layer grown by an Na-Flux method using a solution of an alkali metal Na from its surface to planarize the surface and to appropriately adjust the thickness thereof. Examples of the polishing include polishing using diamond abrasive grains.

The methods of crystal growth for forming GaN single-crystal layers as the second GaN layer 4 do not always have to be the Flux method. For example, the HVPE method or the MOCVD method may be used instead.

The device layer 5 is one or more layers made of a group 13 nitride, which are epitaxially formed on the second GaN layer 4. The specific structure of the device layer 5 may be appropriately defined according to a structure (an LED structure, a HEMT structure, etc.) of a device to be fabricated. Although the device layer 5 is preferably formed by the MOCVD method, it may be formed by the other methods of crystal growth.

FIG. 2 exemplarily illustrates a structure of the device layer 5, for example, when formed with an LED structure. The device layer 5 in FIG. 2 is formed by laminating an n-type semiconductor layer 51, an active layer 52, and a p-type semiconductor layer 53 in this order.

The n-type semiconductor layer 51 is a group 13 nitride layer doped with Si. The n-type semiconductor layer 51 is preferably formed with a thickness of 100 nm to 3000 nm. The n-type semiconductor layer 51 preferably has a concentration of Si approximately ranging from $1 \times 10^{18}/cm^3$ to $1 \times 10^{19}/cm^3$.

The active layer 52 is a layer to be a light-emitting region in an LED element. The active layer 52 is a multiple quantum well layer in which first-unit layers (well layers) 52a and second-unit layers (barrier layers) 52b having mutually different compositions are repeatedly alternately laminated. Specifically, each of the first-unit layers 52a is formed of $In_xGa_{1-x}N$ ($0.05 \leq x \leq 0.25$) with a thickness of 1 nm to 5 nm, and each of the second-unit layers 52b is formed of GaN with a thickness of 2 nm to 10 nm. The molar ratio x of In in $In_xGa_{1-x}N$ is defined according to the wavelength of light to be emitted by the LED element. Furthermore, the number of cycles between the first-unit layers 52a and the second-unit layers 52b are preferably 2 to 20.

The p-type semiconductor layer 53 is a group 13 nitride layer doped with Mg. The p-type semiconductor layer 53 is preferably formed of GaN with a thickness of 50 nm to 200 nm. The p-type semiconductor layer 53 preferably has a concentration of Mg approximately ranging from $5 \times 10^{18}/cm^3$ to $1 \times 10^{20}/cm^3$.

In the MOCVD method, the layers are formed using a known MOCVD furnace with a reactor to which metal organic (MO) source gases for group 13 elements including Ga, Al, and In (trimethylgallium (TMG), trimethylaluminum (TMA), trimethylindium (TMI), etc.), the $NH_3$ gas, the hydrogen gas, and a nitrogen gas can be supplied, by depositing, on a substrate on which the layers are to be formed and which is disposed in the reactor, a group 13 nitride crystal generated from a gas-phase reaction of a metal organic source gas and the $NH_3$ gas while heating the substrate to a predetermined temperature.

In contrast, in the Na-Flux method, the GaN layers are formed roughly by: immersing a substrate on which the GaN layers are to be formed into a solution containing a metal Ga, a metal Na, and carbon, within a growing vessel (alumina crucible) disposed horizontally rotatable in a pressure vessel; and maintaining the growing vessel that is being horizontally rotated, at a predetermined temperature and a predetermined pressure with introduction of a nitrogen gas.

EXAMPLE

Nine types of the device substrates 10 (samples A to I) differing in conditions of forming the first GaN layers 3 were fabricated and evaluated. The LED structure exemplified in FIG. 2 was formed as the device layer 5 therein.

Specifically, first, a single-crystal c-plane sapphire substrate with a diameter of 4 inches and a thickness of 630 μm was prepared as the base substrate 1. The base substrate 1 was put in a MOCVD furnace and heated at a temperature of 1150° C. for ten minutes in an atmosphere of hydrogen to clean the surface thereof.

Next, the substrate temperature was reduced to 500° C., and a GaN layer was grown with a thickness of 30 nm as the buffer layer 2 by the MOCVD method, using TMG and $NH_3$ as materials and hydrogen as a carrier gas.

After forming the buffer layer 2, the first GaN layer 3 was subsequently grown with a thickness of 3 μm by the MOCVD method, using TMG and $NH_3$ as source gases and hydrogen as a carrier gas. Here, the reactor pressure was 100 kPa, and a gas ratio of group 15 to group 13 was 2000. The gas ratio of group 15 to group 13 is a ratio (molar ratio) of the supply amount of a group 15 source to the supply amount of a group 13 source.

Meanwhile, the samples differed in substrate temperature at which the first GaN layers 3 were formed, and in ratio of a partial pressure of a hydrogen gas to that of an $NH_3$ gas (hereinafter referred to as "gas partial pressure ratio") in the MOCVD furnace. Specifically, the substrate temperatures differed at three different levels of 1050° C., 1100° C., and 1150° C. Furthermore, the gas partial pressure ratio represents how many times the partial pressure of the hydrogen gas is higher than that of the $NH_3$ gas, and the gas partial pressure ratios differed at three different levels of 3 times, 4 times, and 5 times. Accordingly, the samples A to I have all different combinations of the substrate temperatures and the gas partial pressure ratios in forming the first GaN layers 3.

The MOCVD-GaN template 6 was obtained by forming the first GaN layer 3. After taking the MOCVD-GaN template 6 out of the MOCVD furnace, each of the samples was measured by Raman spectroscopy to evaluate the intrinsic stress and the crystallinity of the first GaN layer 3. The conditions of an apparatus to be used in the evaluation were as follows:

Light source: $Ar^+$ laser (496.5 nm of wavelength); Measurement mode: microscopic Raman (approximately 0.7 m of beam diameter); and diffraction grating: double, 2400 gr/mm.

Specifically, the Raman spectrum of each of the samples was measured for a total of five times while changing the position to be measured. Then, the Raman line representing the E2 phonons of GaN near the wavenumber of 568 $cm^{-1}$ was fitted by a Lorentzian function for each of the resulting five Raman spectra to obtain a full width at half maximum of the peak. Furthermore, the value of the intrinsic stress was calculated from Equation 1, using the concerned peak as a subject. Averages of the values for the five-time measurements were calculated for both the full width at half maximum and the intrinsic stress, and the averages were determined as evaluation values. The full width at half maximum of the Ar laser plasma line near the wavenumber of 516 $cm^{-1}$ in the Raman spectrum obtained by the measurements was 0.43 $cm^{-1}$.

Furthermore, the second GaN layer 4 was formed on the first GaN layer 3 by the Na-Flux method, using each of the resulting MOCVD-GaN templates 6 as a seed substrate.

Specifically, the MOCVD-GaN template 6 was disposed in an alumina crucible, and subsequently, 30 g of a metal Ga, 44 g of a metal Na, and 30 mg of carbon were charged into the alumina crucible. The alumina crucible was put in a heating furnace and heated for approximately 20 hours at a furnace temperature of 850° C. and a furnace pressure of 4.5 MPa, and then was cooled to the room temperature. After the cooling, upon taking the alumina crucible out of the heating furnace, it was found that a transparent GaN single-crystal layer with a thickness of approximately 50 μm was deposited on the surface of the MOCVD-GaN template 6.

The generated GaN single-crystal layer was polished using diamond abrasive grains to planarize the surface and adjust a total thickness of the nitride layers formed on the base substrate 1 to 15 μm. Accordingly, the Flux-GaN template 7 in which the second GaN layer 4 was formed on the MOCVD-GaN template 6 was obtained. No crack was found by observing the Flux-GaN template 7 by the naked eye.

Finally, the device layer 5 having the LED structure illustrated in FIG. 2 was formed on the resulting Flux-GaN template 7 by the MOCVD method. The specific forming conditions of each layer in the device layer 5 were as follows:

The n-type semiconductor layer 51:
forming temperature=>1100° C.;
reactor pressure=>100 kPa;
gas ratio of group 15 to group 13=>2000;
molar ratio of an Si source to a group 13 source=>$1 \times 10^{-4}$; and
thickness=>1000 nm.

The first-unit layer 52a:
forming temperature=>800° C.;
reactor pressure=>100 kPa;
gas ratio of group 15 to group 13=>10000;
molar ratio of TMI to all group 13 sources=>0.6; and
thickness=>2 nm.

The second-unit layer 52b:
forming temperature=>800° C.;
reactor pressure=>100 kPa;
gas ratio of group 15 to group 13=>20000; and
thickness=>5 nm.

The number of cycles between the first-unit layers and the second-unit layers: 10.

The p-type semiconductor layer 53:
forming temperature=>1000° C.;
reactor pressure=>100 kPa;
gas ratio of group 15 to group 13=>10000;
molar ratio of an Mg source to a group 13 source=>$1 \times 10^{-3}$; and
thickness=>100 nm.

Nine types of the device substrates 10 were obtained by forming the device layers 5 under the above conditions.

Finally, the surface of each of the resulting device substrates 10 was observed by a Nomarski differential interference microscope to determine the presence or absence of occurrence of the streaked morphological abnormality.

Table 1 shows a list of the forming conditions of the MOCVD-GaN templates 6 (forming conditions of the first GaN layers 3), the evaluation results based on Raman spectroscopy, and the presence or absence of occurrence of the streaked morphological abnormality, for the nine types of the device substrates 10 that are the samples A to I. Furthermore, Table 1 also shows whether each of the samples is classified into the embodiment of the present invention or a comparative example.

Specifically, Table 1 shows the film formation temperatures (substrate temperatures) and the gas partial pressure ratios as the forming conditions of the MOCVD-GaN templates 6. Furthermore, Table 1 shows, as the evaluation results based on Raman spectroscopy, the magnitudes of the intrinsic stresses in the first GaN layers 3 that are given from the Raman spectra, and the full width at half maximums of peaks of the E2 phonons of GaN near the wavenumber of 568 cm$^{-1}$ that are indicators of the crystallinity of the first GaN layers 3.

TABLE 1

| | Template forming conditions | | Evaluation results | | | |
|---|---|---|---|---|---|---|
| Sample name | Film formation temperature (° C.) | Gas partial pressure ratio | Intrinsic stress (MPa) | Full width at half maximum (cm$^{-1}$) | Streaked morphological abnormality | Embodiment/ comparative example |
| A | 1150 | 5 times | 330 | 1.6 | Absence | Embodiment |
| B | 1150 | 4 times | 300 | 1.7 | Absence | Embodiment |
| C | 1150 | 3 times | 260 | 1.9 | Absence | Embodiment |
| D | 1100 | 5 times | 270 | 1.7 | Absence | Embodiment |
| E | 1100 | 4 times | 250 | 1.9 | Presence | Comparative example |
| F | 1100 | 3 times | 250 | 2.0 | Presence | Comparative example |
| G | 1050 | 5 times | 250 | 1.8 | Absence | Embodiment |
| H | 1050 | 4 times | 240 | 2.0 | Presence | Comparative example |
| I | 1050 | 3 times | 230 | 2.1 | Presence | Comparative example |

The results in Table 1 demonstrate the absence of the streaked morphological abnormality when the first GaN layer 3 has a compressive stress greater than or equal to 260 MPa, regardless of the forming conditions of the first GaN layer 3. Furthermore, the results also demonstrate the absence of the streaked morphological abnormality when the full width at half maximum of the E2 phonons in the first GaN layer 3 is smaller than or equal to 1.8 cm$^{-1}$, regardless of the forming conditions of the first GaN layer 3.

Although there is no upper limit in the compressive stress intrinsic in the first GaN layer 3 in theory, the intrinsic compressive stress is preferably smaller than or equal to 1500 MPa, and is more preferably smaller than or equal to 1000 MPa to suppress increase in the amount of warp in the MOCVD-GaN template 6 or the Flux-GaN template 7 and decrease in the yield of the device fabrication processes. Furthermore, although there is no lower limit in the full width at half maximums of the E2 phonons in the first GaN layer 3 in theory, the substantial lower limit is 1.0 cm$^{-1}$ in consideration of the limitations in the resolution of Raman spectroscopy.

The invention claimed is:

1. A GaN template substrate, comprising:
a base substrate made of sapphire; and
a first GaN layer epitaxially formed on said base substrate,
wherein a full width at half maximum of a peak near a wavenumber of 568 cm$^{-1}$ in a Raman spectrum is lower than or equal to 1.8 cm$^{-1}$, the peak representing E2 phonons of GaN, the Raman spectrum being obtained by measuring said first GaN layer by Raman spectroscopy, and
wherein said first GaN layer is formed with a thickness of 1 µm to 5 µm.

2. The GaN template substrate according to claim 1, further comprising a second GaN layer epitaxially formed on said first GaN layer.

3. The GaN template substrate according to claim 1, further comprising
a buffer layer formed on said base substrate and made of GaN,
wherein said first GaN layer is epitaxially formed on said buffer layer.

4. A GaN template substrate, comprising:
a base substrate made of sapphire;
a buffer layer formed on said base substrate and made of GaN; and
a first GaN layer epitaxially formed on said buffer layer,
wherein said first GaN layer has a compressive stress greater than or equal to 260 MPa, the compressive stress being intrinsic in an inplane direction, and
a full width at half maximum of a peak near a wavenumber of 568 cm$^{-1}$ in a Raman spectrum is lower than or equal to 1.8 cm$^{-1}$, the peak representing E2 phonons of GaN, the Raman spectrum being obtained by measuring said first GaN layer by Raman spectroscopy, and
wherein said first GaN layer is formed with a thickness of 1 µm to 5 µm.

5. The GaN template substrate according to claim 4,
wherein a value of the compressive stress is obtained from a Raman spectrum obtained by measuring said first GaN layer by Raman spectroscopy.

6. The GaN template substrate according to claim 4, further comprising a second GaN layer epitaxially formed on said first GaN layer.

* * * * *